(12) United States Patent
Goto et al.

(10) Patent No.: US 8,487,532 B2
(45) Date of Patent: Jul. 16, 2013

(54) SEALING FOR PANELS OF AN ORGANIC ELECTROLUMINESCENCE DISPLAY AND LIGHTING APPARATUS

(75) Inventors: Yoshihide Goto, Sagae (JP); Taiki Goto, Sagae (JP)

(73) Assignee: Goto Denshi Co., Ltd., Sagae-Shi (JP)

( * ) Notice: Subject to any disclaimer, the term of this patent is extended or adjusted under 35 U.S.C. 154(b) by 59 days.

(21) Appl. No.: 12/807,860

(22) Filed: Sep. 14, 2010

(65) Prior Publication Data
US 2012/0062111 A1    Mar. 15, 2012

(51) Int. Cl.
*H01L 51/50*      (2006.01)
(52) U.S. Cl.
USPC .......................................... 313/512; 313/504
(58) Field of Classification Search
None
See application file for complete search history.

(56) References Cited

U.S. PATENT DOCUMENTS

| | | | | |
|---|---|---|---|---|
| 5,013,967 | A * | 5/1991 | Hirotaka et al. | 313/512 |
| 7,944,144 | B2 * | 5/2011 | Gomi | 313/512 |
| 7,990,060 | B2 * | 8/2011 | Ahn et al. | 313/512 |
| 2005/0001545 | A1 * | 1/2005 | Aitken et al. | 313/512 |
| 2009/0066244 | A1 * | 3/2009 | Tassini et al. | 313/512 |
| 2010/0327737 | A1 * | 12/2010 | Hayashi et al. | 313/504 |

* cited by examiner

*Primary Examiner* — Britt D Hanley
(74) *Attorney, Agent, or Firm* — Masuvalley & Partners (57) ABSTRACT

An organic EL display device or a lighting device is covered by sealing the top and bottom, left and right, front and back, that is the entire body and periphery of the panel, with an air-impermeable sealing resin. Dipping the substrate plate or printing the sealing resin onto the substrate plate is applied to the substrate plate excluding the display area and light emitting area of the organic EL panel to block intrusion of air and moisture that affect the life of the organic EL element. With this, the life of an organic EL panel can be extended, and large screen size and mass production of panel can be also easily accomplished.

20 Claims, 7 Drawing Sheets

Prior Art

SEALING FOR PANELS OF AN ORGANIC ELECTROLUMINESCENCE DISPLAY AND LIGHTING APPARATUS

TECHNICAL FIELD

The present invention relates to a technology of sealing of organic electroluminescence (EL) display device or lighting device and sealants.

BACKGROUND OF THE INVENTION

Though organic EL display devices with a superior picture quality than liquid crystals and lower power consumption are expected to be the dream panels, the technology for extending the life and increasing the screen size was difficult which has been causing a delay in commercialization. Organic EL display devices, and their light emission principles are well known, and the technology for making their energy consumption extremely low to protect the earth environment is progressing. However, organic EL elements are sensitive to moisture, and organic EL elements are easily prone to degradation and deterioration by moisture. As a result, a decline in quantum efficiency is accelerated, and the life is said to be about 10,000-20,000 hours. That is, the degradation and deterioration of organic EL elements by moisture have made mass production of organic EL display devices difficult.

Figure 10:
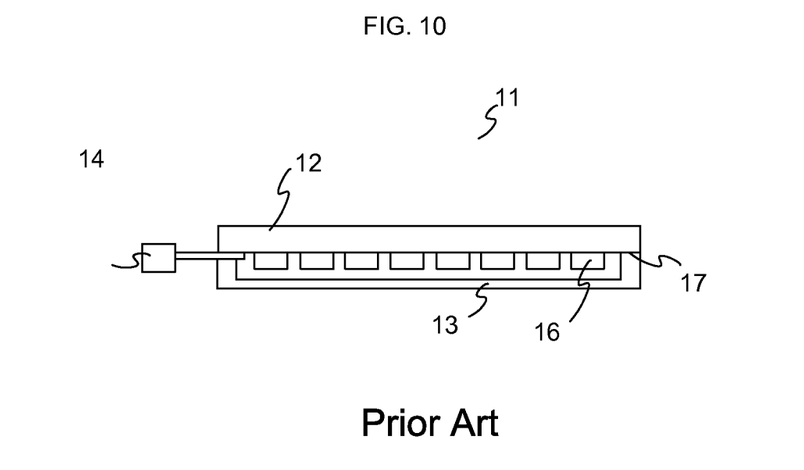
FIG. 10 is a cross-sectional view of an organic EL display device provided in the prior art.

FIG. 10 shows a prior art of sealing an organic EL display device. In this, a substrate plate 12 is made of glass, resin, film etc. Then, an organic EL element 16 is sandwiched along with a corresponding sealing case 13, the sealing case 13 being made, for example, of a metal. The organic EL element 16 is an element, which has low voltage of about a few volts to tens of volts and is capable of self-light emission. Since the organic EL element 16 is self-emitting type, it has a wide viewing angle and a high visibility. The organic EL 16 element being a completely thin film type solid-state element, can be made small and thin. Adhesive 17 is used for joining the substrate plate 12 and the sealing case 13. Substrate plate 12 and sealing case 13 are secured by joining the substrate plate 12 and the sealing case 13 with adhesive 17. In this manner, intrusion of moisture to the organic EL element 16 through the gap between the substrate plate 12 and the sealing case 13 was prevented in the prior art.

However, in such a technology, there used to be permeation of air or moisture from the adhesive 17, the substrate plate 12 and the sealing case 13, and due to degradation of the organic EL element 16, there were many instances of failure to emit light. To prevent this, a drying agent was provided between the substrate plate 12 and the sealing case 13. However, as the absorption efficiency depends on the material used, it was not possible to realize a performance beyond the absorption efficacy. For example, with a drying agent, only a maximum of about 20000 hours could be guaranteed. With this, if moisture absorption of the drying agent is not possible, the organic EL element 16 deteriorates, and as the number of light emitting elements of the organic EL display device 11 becomes less, the life of the panel itself is shortened. In particular, since the reliability of a panel is affected by natural environmental conditions such as temperature condition, humidity condition and atmospheric condition under which the organic EL display device 11 is used, it was difficult to guarantee a high reliability of the organic EL display device 11.

SUMMARY OF THE INVENTION

The present invention solved this problem by sealing the entire organic EL display device or lighting device, and realized prolonging the life of the organic EL element.

That is, the entire organic EL display panel is covered by sealing the top and bottom, left and right, front and back, and the entire periphery of the panel with an air-impermeable resin. Or, by dipping the substrate plate into the resin or printing the resin onto the substrate plate excluding the display part and light emitting part of the organic EL panel, it is possible to block air and moisture which affect the life of the organic EL element. The present invention intends to extend the life of organic EL panel by this approach.

Specifically, the organic EL display device of the first embodiment of this invention has a transparent substrate plate, an organic EL element provided on one side of the substrate plate and a terminal for applying relevant voltage to the organic EL element, and involves completely sealing the organic EL display device with a sealant.

The sealing material for completely sealing the organic EL display device is a transparent sealing material. Further, the sealing material used for sealing the whole organic EL display device seals the entire body as well as the periphery of the display device. In this case, it is also possible to have a configuration wherein the entire body and the periphery are sealed with a sealing material while excluding the terminal. The organic EL display device may be further provided with a sealing case installed facing the substrate plate, and the substrate plate and the sealing case can be secured by providing an adhesive containing glass pieces of length not greater than 10 μm in the gap between the substrate plate and the sealing case. This transparent sealing material may even completely cover the sealing case. Further, the organic EL display device may be provided with a spacer between the inner surface that has been sealed with the sealing material and the substrate plate or the sealing case, and at least one drying agent may also be provided in the space between the spacer and the substrate plate or the sealing case.

The second embodiment of this invention provides an organic EL display device including: a substrate plate; an organic EL element provided on the substrate plate; a sealing case provided on the side facing the organic EL element is provided on the substrate plate; a first sealant provided between the sealing case and the substrate plate; a terminal connected to the organic EL element for applying electrical voltages to the terminal; the end section of the organic EL display device is sealed with a reinforcing material; and the reinforcing material is further sealed with a plurality of layers of a second transparent sealant.

The first sealant may be prepared by mixing finely crushed glass with a pure resin. From the point of characteristics also, it is preferable that the finely crushed glass has a length not greater than 10 μm. The reinforcing material for reinforcing the end section of the organic EL display device may be provided on the periphery of the organic EL display device. The reinforcing material that reinforces the end section of the organic EL display device may be formed from metal, glass or resin. Moreover, the reinforcing material that reinforces the end section of the organic EL display device may also be provided on a part of the periphery of the organic EL display device. It is also possible to provide the second sealant out of a region in which the organic EL element is formed. A drying agent may also be set inside or outside the reinforcing material.

The third embodiment of this invention provides an organic EL lighting device including: a substrate plate; an organic EL element provided on one side of the substrate plate; a terminal for applying electrical voltages to the organic EL element; and the vertical and lateral surfaces of this organic EL display device are completely sealed with a transparent or translucent sealant.

In this case, excluding the terminal section, the entire surface is sealed with a transparent or a translucent sealant. The organic EL display device may be further provided with a sealing case facing the substrate plate, and an adhesive-based sealant may be provided between the substrate plate and the sealing case. The sealing case may also be covered with transparent or translucent sealant. The adhesive-based sealant may be prepared by mixing finely crushed glass with a pure resin, wherein the finely crushed glass shall have a length not greater than 10 μm.

DETAILED DESCRIPTION OF THE INVENTION

First Embodiment

Figure 1:
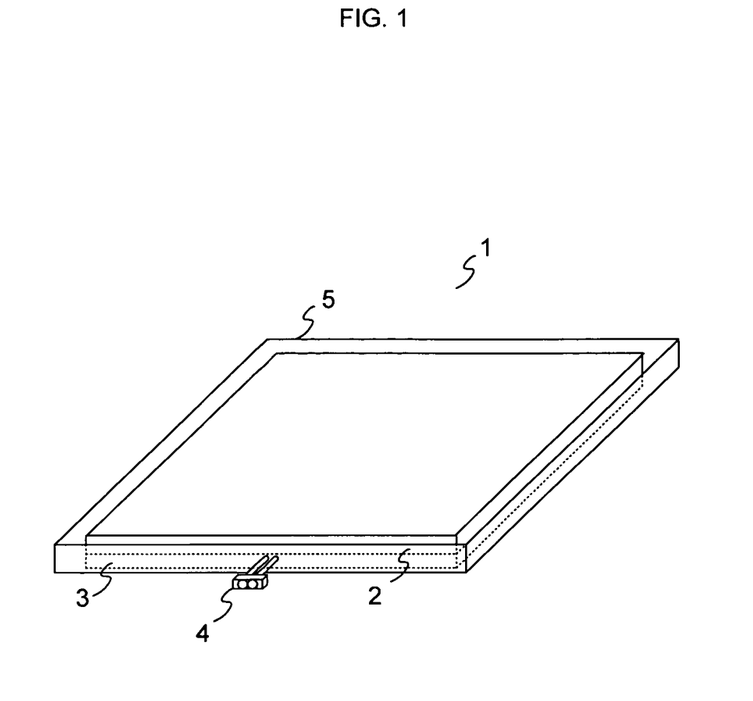
FIG. 1 is a perspective view of an organic EL display device of the first embodiment.

FIG. 1 is a perspective view of an organic EL display device 1 provided in the first embodiment. The organic EL display device 1 includes: a transparent substrate plate 2; a sealing case 3; an organic EL element 6 provided in the substrate plate (not illustrated in FIG. 1), and a terminal 4 for applying voltage to the organic EL element 6. In this embodiment, the whole organic EL display device 1 is sealed with a sealant 5.

Here, the organic EL display device 1 is one kind of flat panel types. Cathode and anode are formed into a stripe form. An organic EL element 6, which is formed from organic material, is provided in a section where cathode and anode intersect as an image element in the organic EL display device 1. Here, the organic material is a molecular compound comprised of carbon as the major constituent, nitrogen, oxygen and hydrogen.

The transparent plate 2 is a substrate plate such as glass plate etc., and the organic EL element 6 in a matrix shape is provided on the substrate plate. Apart from glass plate, various materials such as acrylic material, resin or film etc., can be used for the transparent plate 2.

The sealing case 3 is a case provided for protecting the organic EL element 6 provided on the transparent plate 2 from external atmosphere. As explained earlier, organic EL element 6 is sensitive to moisture, and easily prone to degradation and deterioration by moisture. This hastens a decrease in the quantum efficiency resulting in a shortening of the life of the organic EL display device 1. Therefore, the intrusion of moisture to the organic EL element 6 provided on the transparent substrate plate 2 is prevented by this sealing case 3.

The terminal 4 for applying voltage to the organic EL element 6 is a connection terminal using copper foil, lead wires, metal fittings for terminal etc. The terminal 4 passes current by externally applying a voltage of few volts to the organic EL element 6, and causes the organic thin film to emit light. By injecting current to the organic EL element 6, the organic molecule is shifted to an excited state, and when the organic molecule returns to the initial ground state, excess energy is released as lights, and the organic molecule in the organic EL element 6 emits lights.

In this embodiment, as for a sealant 5, a transparent and pure resin is used as a sealing material. This is because using a resin containing impurities, irrespective of conducting or non-conducting impurities, as the sealant 5 weakens the material against the breakdown voltage. Specifically, an uncured sealing resin is applied in the entire periphery of the organic EL display device 1 by such as dipping or printing or other method, and then the sealing resin is cured. Still, although an uncured sealing resin is applied on the entire periphery of the organic EL display device 1 in this embodiment, it is also possible to provide a coating only in areas excluding the emitting surface and display surface of the organic EL display device 1 to obtain a higher intensity.

Taking the case of coating the entire periphery as an example, the thickness of uncured resin sealant 5 can be adjusted with a thickness-adjusting tool, and the uncured resin sealant 5 is coated over the entire panel. Then, it is inverted, and the opposite side is also coated similarly. The entire periphery is coated by also coating the sides. When not coating on the emitting surface and display surface, coating is provided on one side by adjusting the thickness of uncured resin sealant 5 with a thickness-adjusting tool as in case of coating on the entire periphery. Coating is provided on the sides, by excluding emitting surface and display surface, as in the coating of the entire periphery. However, coating of the sealant 5 is not restricted to this method, and various modifications are possible.

In this embodiment, the sealant 5, which seals the whole organic EL display device 1, seals the whole body as well as the periphery of the display device by a sealing material. With this, it makes possible not to allow intrusion of air and moisture, and thus prevent any adverse effect on the organic EL element 6. Even the terminal 4 is coated with the sealant 5 by providing the lead wires to the terminal 4. However, it may have a configuration in which coating of the sealant 5 is performed on the display device excluding the terminal 4.

Figure 2:
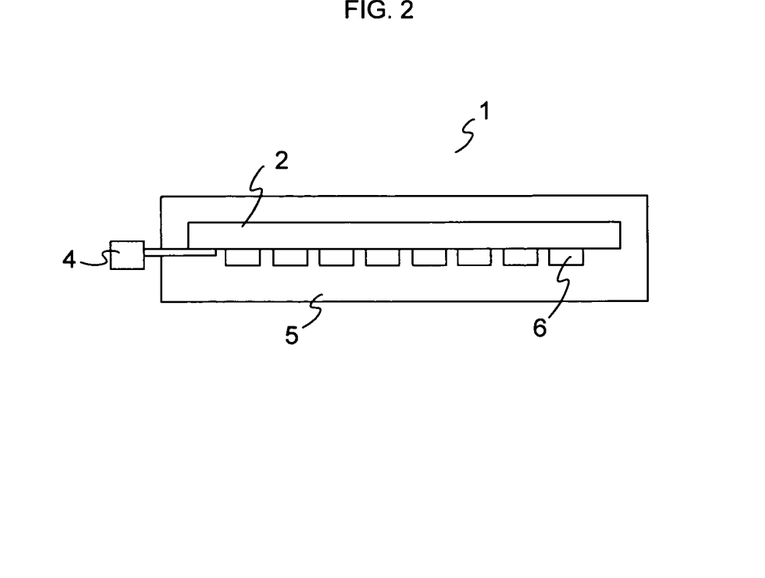
FIG. 2 is a cross-sectional view of the organic EL display device provided in the first embodiment.

FIG. 2 is a cross-sectional view of the organic EL display device 1 provided in the first embodiment. In this embodiment, a sealing case 3 is not provided. Instead, the substrate plate 2 and entire organic EL element 6 are coated with the sealant 5. Since the organic EL element 6 is sensitive to moisture, as degradation or deterioration of the organic EL element due to moisture may easily occur, a sealing case 3 needs to be provided in most cases. However, depending on the use environment of the organic EL display device 1, a sealing case 3 may be omitted. Therefore, the configuration in this embodiment does not have a sealing case 3. Both substrate plate 2 and sealant 5 are constituted from transparent members. With this, light can emit from both directions.

Figure 3:
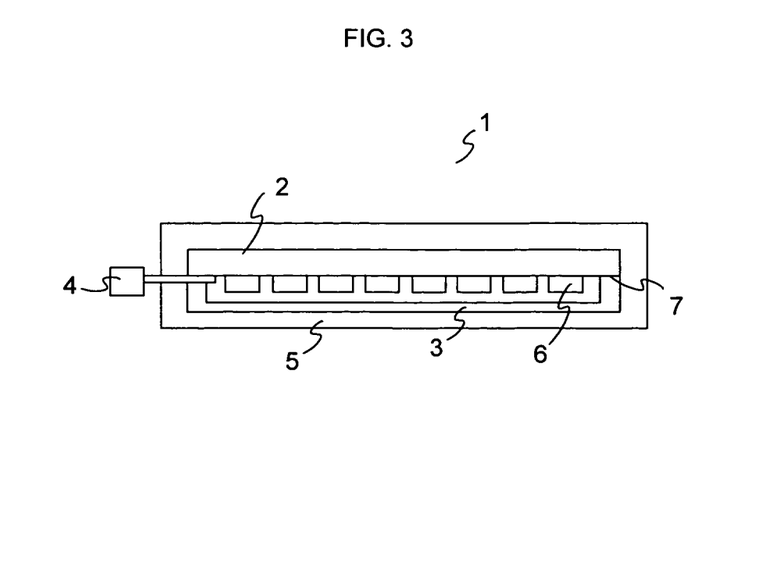
FIG. 3 is a cross-sectional view of the organic EL display device provided in the first embodiment equipped with a sealing case.

However, it is also possible to constitute either the substrate plate 2 or the sealant 5 or both from translucent or opaque members. FIG. 3 is a cross-sectional view of the organic EL display device 1 provided with a sealing case 3. In this embodiment, which is different from the above embodiment, a sealing case 3 has been provided. A sealing case 3 is provided to the organic EL element 6 that has been provided on a transparent substrate plate 2. As explained earlier, the organic EL element 6 is sensitive to moisture, and easily susceptible to degradation and deterioration by moisture. The intrusion of moisture to the organic EL element 6 provided on the transparent substrate plate 2 is prevented by the sealing case 3. The sealant 5 completely envelopes the sealing case 3. With such a configuration, the intrusion of moisture to the organic EL element 6 can be prevented to a great extent.

Further, the substrate plate 2 and the sealing case 3 are secured by providing between the substrate plate 2 and the sealing case 3 an adhesive 7 containing glass pieces of length not greater than 10 μm. With this, the intrusion of moisture through the gap between substrate plate 2 and sealing case 3 can be prevented, and the lifetime of the organic EL display device 1 can be improved. The adhesive 7 includes of a pure resin mixed with finely crushed glass pieces of length not greater than 10 μm. With this, compared to the resin-based adhesives used conventionally, the intrusion of oxygen and moisture to the organic EL element 6 can be further prevented by preserving the characteristics of glass.

In this embodiment, in addition to securing the substrate plate 2 and the sealing case 3 by providing the adhesive 7 containing glass pieces of length not greater than 10 μm between the substrate plate 2 and the sealing case 3, the entire body of the substrate plate 2 and the sealing case 3 is sealed with a transparent sealant 5. With this, the intrusion of moisture to the organic EL element 6 can be prevented to a very great extent, and the degradation or deterioration of the organic EL element 6 due to moisture can be greatly controlled. By significantly improving the deterioration or degradation of the organic EL element due to moisture, mass production of a long-life organic EL display device 1 becomes easy.

Figure 4:
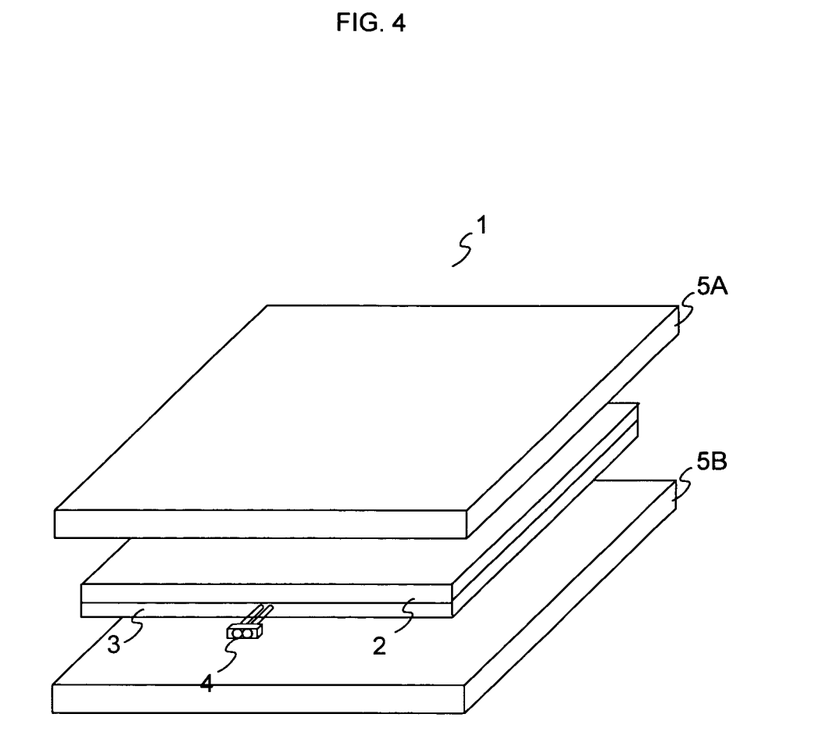
FIG. 4 is a perspective view of a modified organic EL display device.

FIG. 4 is a perspective view of a modified organic EL display device 1. In this working example, the entire substrate plate 2 and sealing case 3 are sandwiched between sealants 5A and 5B. Thereupon, it is made into a configuration in which the space between sealants 5A and 5B is further closed with a sealant or an adhesive. In this working example, the method of providing the sealant 5 differs from that in the earlier working examples. Further, either of the methods employed in the working example mentioned in FIG. 2 or working example mentioned in FIG. 3 may be used.

Second Embodiment

Figure 5:
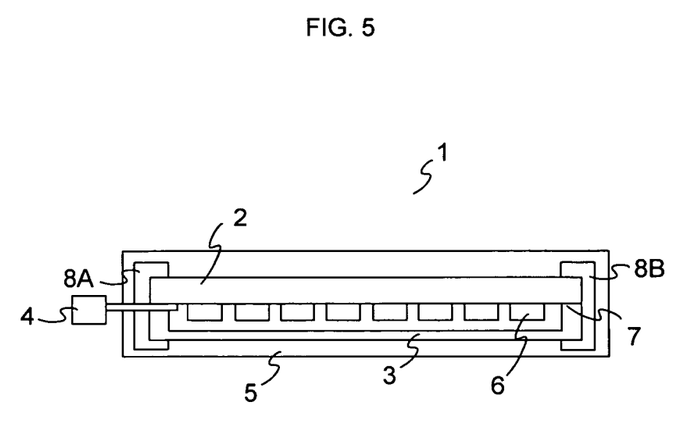
FIG. 5 is a cross-sectional view of an organic EL display device provided in the second embodiment.

FIG. 5 is a cross-sectional view of an organic EL display device 1 provided in the second embodiment. The organic EL display device 1 provided in this embodiment has: a substrate plate 2; an organic EL element 6 provided on the substrate plate 2; a sealing case 3 provided on the substrate plate 2 facing the organic EL element 6; a first sealant 7 provided as an adhesive between the sealing case 3 and the substrate plate 2; and a terminal 4 connected to the organic EL element 6 for applying voltage thereto. In this embodiment, the end part of the organic EL display device 1 is sealed with reinforcing materials 8A and 8B, and further sealed with a plurality of layers of a transparent second sealant 5 provided by covering the reinforcing materials 8A and 8B. With such a configuration, contamination of the organic EL element 6 by external atmosphere can be prevented apart from greatly improving the strength of the organic EL display device 1. It is also possible to make the organic EL display device 1 thin.

Adhesive 7, which is the first sealant, is a sealant prepared by mixing a pure resin with finely crushed glass. The finely crushed glass is characterized by having a length not greater than 10 μm and by maintaining the characteristics of glass, compared to the conventionally used resin-based adhesives, the intrusion of oxygen and moisture to the organic EL element 6 can be effectively prevented.

The reinforcing materials 8A and 8B for reinforcing the end section of the organic EL display device 1 are made from metal, glass or resin, and provided in the periphery of the organic EL display device 1. In addition, with satisfactory strength, the reinforcing materials 8A and 8B that reinforce the end section of the organic EL display device 1 may also be provided in a part of the periphery of the organic EL display device 1. This working example is explained with FIG. 7.

Figure 6:
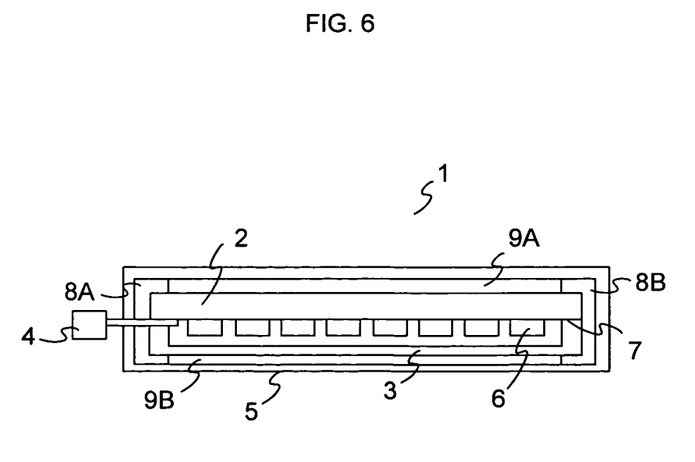
FIG. 6 is a cross-sectional view of an organic EL display device provided with spacers between the sealant and the substrate plate for installing a drying agent.

FIG. 6 is a cross-sectional view of the organic EL display device 1 further provided with spacers 9A and 9B for installing a drying agent between the sealant 5 and the substrate plate 2. A drying agent is explained with FIG. 8. The drying agent is provided to protect the organic EL element 6 from moisture by absorbing any moisture that may intrude temporarily. However, since a drying agent cannot perform beyond its capacity, and despite being dependent on the environment, maximum 20000 hours is mostly guaranteed with a single drying agent. In this working example, by providing spacers 9A and 9B, the drying efficiency can be greatly improved by plural installations of the drying agent between the substrate plate 2 and the spacer 9A or the sealing case 3 and the spacer 9B. For example, when guaranteeing a maximum of 20000 hours with one drying agent, the guaranteed period can be increased to such as 40000 hours, 60000 hours etc. by installing it in multiple numbers such as 2, 3 etc., respectively. Therefore, in addition to providing a drying agent between either the substrate plate 2 and the space 9A or the sealing case 3 and the spacer 9B or both, the drying agent may also be provided in single, double, or triple layers.

Figure 7:
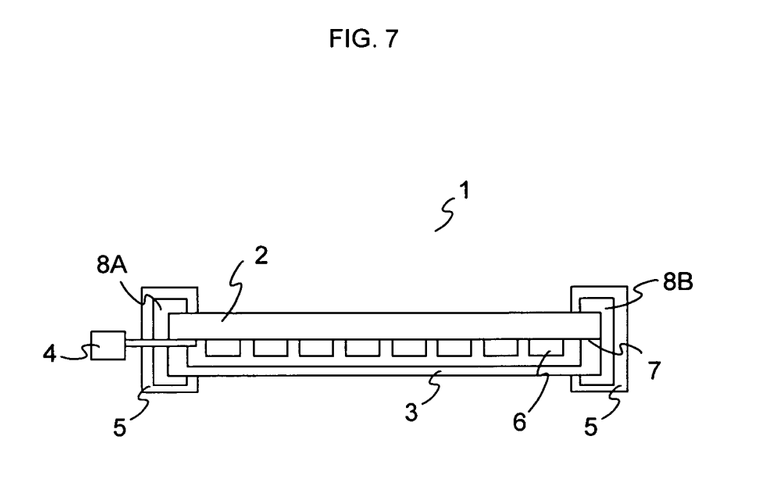
FIG. 7 is cross-sectional view of an organic EL display device that is not provided with a sealant in the display area.

FIG. 7 is cross-sectional view of an organic EL display device 1 that is not provided with the sealant 5 in the display area of the organic EL display device 1. In this case, the sealant 5 is provided outside of the organic EL element 6. In this working example, depending on the use environment of the organic EL display device 1, utilization may be contemplated in cases where high brightness is required from the organic EL element 6, or where the strength of the sealant 5 already quite strong. With this, the manufacturing cost becomes low, and a panel of large screen size also becomes feasible. In this working example, the sealing case 3 may also be constituted from a transparent member, and configured to allow irradiation from behind. This is particularly effective when using as a lighting device (explained later).

Figure 8:
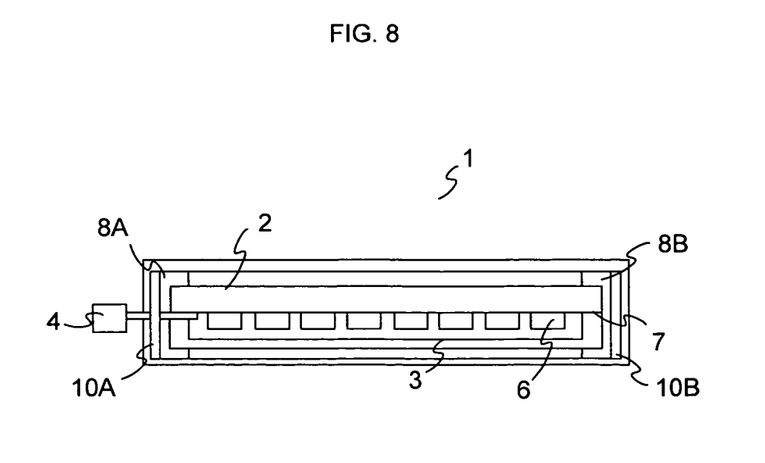
FIG. 8 is a cross-sectional view of an organic EL display device provided with a drying agent.

FIG. 8 is a cross-sectional view of an organic EL display device 1 provided with a drying agent. The drying agents 10A and 10B are provided on the outside of the reinforcing materials 8A and 8B. Drying agents 10A and 10B are provided for eliminating residual moisture inside the panel or the moisture released from the adhesive 7 or sealant 5. As examples of the drying agents 10A and 10B, calcium oxide (CaO), calcium chloride (CaCl2), and barium oxide (BaO) etc. can be offered. In this example, in addition to providing the drying agents 10A and 10B, the sealant 5 is further coated over the entire surface. As explained in FIG. 6, these drying agents 10A and 10B may be provided in single, double or triple layers as possible to enhance the drying efficiency of the drying agent.

The drying agents 10A and 10B in this example may also be used in other working examples. In particular, the drying agents 10A and 10B can be used in the configurations illustrated in FIG. 5 or FIG. 7. In case of FIG. 5, the drying agent may be provided over the entire sealing case 3. On the other hand, if the display section is to be protected on both the substrate plate 2 and the sealing case 3 as illustrated in FIG. 7, it is advisable to provide the drying agents 10A and 10B at sides as shown in FIG. 8. Moreover, the drying agents 10A and 10B may be provided only in a part of the outer periphery of the organic EL display device 1 as described in FIG. 7. It is also possible to protect the emitting region required for display. Or, if large amounts of drying agent are necessary, the entire outer periphery of the organic EL display device 1 may be enclosed with the drying agent 10A and 10B. It is also possible to integrate the drying agents 10A and 10B with the reinforcing materials 8A and 8B, or to provide the reinforcing materials 8A and 8B outside the drying agents 10A and 10B. In particular, major portion of moisture from the organic EL element 6 can better be absorbed by providing the drying agent within the reinforcing material. However, from the view point of ease of manufacturing of the organic EL display device 1, it is preferable to install the drying agent outside the reinforcing material as shown in FIG. 8.

Figure 9:
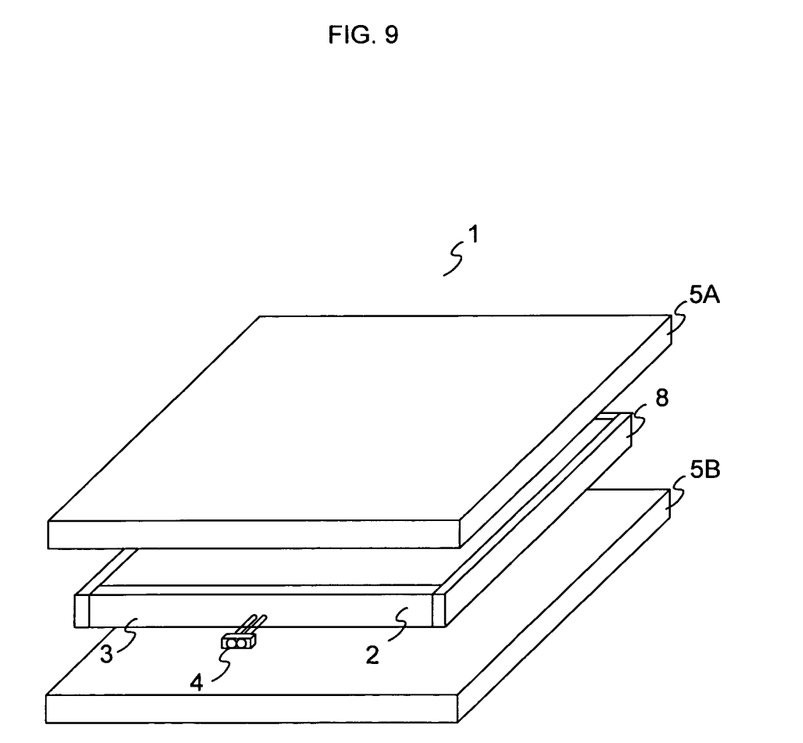
FIG. 9 is a perspective view of an organic EL display device provided in the second embodiment.

FIG. 9 is a perspective view of the organic EL display device 1 provided in the first embodiment. In this example, a reinforcing material 8 is provided by covering the entire periphery of substrate plate 2 and sealing case 3. The reinforcing material 8 does not need to be provided on all 4 sides, but instead may be provided on any of the 1 to 3 sides that are different from the one shown in FIG. 9. As shown in FIG. 9, the sealant may also be divided into two parts as the sealants 5A and 5B, and the reinforcing material 8 can be inserted between the sealants 5A and 5B. Further, the space between sealants 5A and 5B may be sealed with a sealant or an adhesive.

Third Embodiment

The third embodiment of the present invention relates to an organic EL lighting device. An organic EL lighting device, unlike incandescent bulb or fluorescent tube, can be used as a very thin and small source of light, and as it can illuminate a wide area because of surface emission unlike a LED (Light-Emitting Diode), it is being anticipated as a next generation light source.

The third embodiment of this invention provides an organic EL lighting device 1 provided with: a substrate plate 2; an organic EL element 6 provided on one side of the substrate plate 2; a terminal 4 for applying voltage to the organic EL element 6; and the vertical and lateral surfaces of this organic EL display device 1 are completely sealed with a transparent or translucent sealant 5.

The organic EL lighting device 1 of this embodiment may have all the configurations illustrated in FIG. 1 to FIG. 9 described above. FIG. 1 to FIG. 9 can be used to explain the organic EL lighting device 1. However, in organic EL lighting device 1, the substrate plate 2 is not necessarily transparent, and it can also be translucent or opaque provided that it can be used in emission.

In organic EL lighting device 1, a configuration shown in FIG. 2 is preferred for effective emission from not only the substrate plate 2, but also from the sealing case 3. However, even in case of FIG. 3 to FIG. 8, a configuration without a sealing case 3 can be adopted. Or, it is also possible to practice an organic EL lighting device 1 with a transparent sealing case 3.

As explained above, it is possible to suitably vary the various members and configuration elements in the organic EL display device and the organic EL lighting device of these examples. For example, to realize a lighting device to illuminate a wide area, appropriate modifications are possible to manifest the advantages of the surface emission, such as making the profile of the sealant 5 towards the display surface as a smooth tapered profile.

In addition, this invention can also be applied to organic semiconductors, organic solar panels etc. In these cases, since the performance can be satisfactorily obtained even without a drying agent, it is also possible to adopt a configuration that does not require the drying agents 10A and 10B.

What is claimed is:

1. An organic EL display panel comprising:
a transparent substrate;
an organic EL element formed on a first side of said substrate;
a sealing case provided on said first side of said transparent substrate facing said organic EL element;
a terminal for connecting to the organic EL element wherein said terminal has an interior part between said sealing case and said transparent substrate and an exterior part exterior to said substrate;
a first sealant as an adhesive is provided between said sealing case and said transparent substrate;
an end section of said organic EL display panel; and
a reinforcing material adjacent to said end section;
a transparent sealing material wherein:
said transparent sealing material covers entirely said reinforcing material, and
a drying agent is provided on an outer periphery of the reinforcing material so that the drying agent is positioned between said transparent sealing material and said reinforcing material.

2. The organic EL display panel according to claim 1, wherein said first sealant is obtained by mixing finely crushed glass pieces with a pure resin.

3. The organic EL display panel according to claim 2, wherein said finely crushed glass pieces have a length not greater than 10 μm.

4. The organic EL display panel according to claim 1, wherein said reinforcing material is made from a material selected from the group consisting of metal, glass and resin.

5. The organic EL display panel according to claim 1, wherein said reinforcing material has an upper lip and a lower lip wherein said transparent substrate and said sealing case fit between said upper lip and said lower lip.

6. An organic EL lighting device comprising:
a substrate;
an organic EL element provided on a first side of said substrate; and
a sealing case provided on said first side of said substrate facing said organic EL element;
a terminal connected to said organic EL element wherein said terminal has an interior part between said sealing case and said transparent substrate and an exterior part exterior to said substrate;
an adhesive for securing said sealing case to said transparent substrate;
an end section of said organic EL lighting device;
a reinforcing material adjacent to said end section; and
a sealant completely encasing said organic EL lighting device except a portion of said exterior part of said terminal,
wherein a drying agent is provided on an outer periphery of the reinforcing material so that the drying agent is positioned between said sealant and said reinforcing material.

7. The organic EL lighting device according to claim 6, wherein said sealant is transparent.

8. The organic EL lighting device according to claim 6, wherein said sealing case is transparent.

9. The organic EL lighting device according to claim 6, wherein said adhesive contains finely crushed glass pieces.

10. The organic EL lighting device according to claim 9, wherein said finely crushed glass pieces have a length not greater than 10 µm.

11. The organic EL lighting device according to claim 6, wherein said sealant is translucent.

12. The organic EL display panel according to claim 1, wherein the transparent sealing material is provided in a plurality of layers.

13. The organic EL display panel according to claim 1, wherein the transparent sealing material further covers an entire display area including the transparent substrate and the sealing case of said organic EL display panel.

14. The organic EL display panel according to claim 13 further comprising a space between the transparent sealing material and the transparent substrate wherein the space contains a transparent drying agent.

15. The organic EL display panel according to claim 14 further comprising a space between the transparent sealing material and the sealing case wherein the space contains a transparent drying agent.

16. An organic EL display panel comprising:
a transparent substrate;
an organic EL element formed on a first side of said substrate;
a sealing case provided on said first side of said transparent substrate facing said organic EL element;
a terminal for connecting to the organic EL element wherein said terminal has an interior part between said sealing case and said transparent substrate and an exterior part exterior to said substrate;
a first sealant as an adhesive is provided between said sealing case and said transparent substrate;
a reinforcing material adjacent to an end section of said organic EL display panel; and
a transparent sealing material covering entirely said reinforcing material, wherein a drying agent comprising calcium oxide (CaO), calcium chloride (CaCl2), or barium oxide (BaO) is provided between said transparent sealing material and said reinforcing material.

17. The organic EL lighting device according to claim 6, wherein the substrate is transparent.

18. The organic EL lighting device according to claim 6, wherein the substrate is translucent or opaque.

19. The organic EL lighting device according to claim 6, wherein the sealant is provided in a plurality of layers.

20. An organic EL lighting device comprising:
a substrate;
an organic EL element provided on a first side of said substrate; and
a sealing case provided on said first side of said substrate facing said organic EL element;
a terminal for applying voltage to said organic EL element;
an adhesive for securing said sealing case to said transparent substrate;
a reinforcing material adjacent to an end section of said organic EL lighting device; and
a sealant completely encasing said organic EL lighting device,
wherein a drying agent comprising calcium oxide (CaO), calcium chloride (CaCl2), or barium oxide (BaO) is provided between said transparent sealing material and said reinforcing material, and further over an entire surface of said sealing case.

* * * * *